United States Patent [19]

Liberty et al.

[11] Patent Number: 5,213,868
[45] Date of Patent: May 25, 1993

[54] THERMALLY CONDUCTIVE INTERFACE MATERIALS AND METHODS OF USING THE SAME

[75] Inventors: James Liberty, Hollis; Peter Jones, Londonderry, both of N.H.

[73] Assignee: Chomerics, Inc., Woburn, Mass.

[21] Appl. No.: 744,568

[22] Filed: Aug. 13, 1991

[51] Int. Cl.⁵ .......................... B32B 3/10; B32B 3/28; H05K 7/20
[52] U.S. Cl. ................................... 428/131; 428/168; 428/354; 361/388; 257/712
[58] Field of Search ................ 174/252; 361/386, 388, 361/389; 357/81; 428/344, 356, 131, 168

[56] References Cited

U.S. PATENT DOCUMENTS

| | | | |
|---|---|---|---|
| 3,391,242 | 7/1968 | Sudges | 174/15 |
| 4,151,547 | 4/1979 | Rhoades et al. | 357/81 |
| 4,258,100 | 3/1981 | Fujitani et al. | 428/356 X |
| 4,548,862 | 10/1985 | Hartman | 428/356 X |
| 4,574,879 | 3/1986 | DeGree et al. | 165/185 |
| 4,606,962 | 8/1986 | Reylek et al. | 428/148 |
| 4,654,754 | 3/1987 | Daszkowski | 361/388 |
| 4,737,112 | 3/1988 | Jin et al. | 428/356 X |
| 4,796,157 | 1/1989 | Ostrem | 357/81 X |
| 4,835,598 | 5/1989 | Higuchi et al. | 357/81 X |
| 4,869,954 | 9/1989 | Squitieri | 428/283 |
| 4,901,137 | 2/1990 | Sato et al. | 357/81 |
| 5,142,441 | 8/1992 | Seibold et al. | 361/382 X |

*Primary Examiner*—Jenna L. Davis
*Assistant Examiner*—B. Copenheaver
*Attorney, Agent, or Firm*—John Dana Hubbard; William L. Baker

[57] ABSTRACT

A thermally conductive interface material formed of a polymeric binder and one or more thermally fillers is disclosed. One or both of the major surfaces of the interface material has a means for removing air from between that surface and the surface to which it is attached, such as a heat sinker an electronic component. Alternatively, the heat sink or component may have the air removal means instead of or in addition to the interface material. The air removal means may be a series of embossments, channels or grooves or throughholes. Preferably, the interface is a pressure sensitive acrylic adhesive material and more preferably, it is in the form of a tape.

6 Claims, 3 Drawing Sheets

THERMALLY CONDUCTIVE INTERFACE MATERIALS AND METHODS OF USING THE SAME

The present invention relates to a thermally conductive interface material, an apparatus and a method for applying the same to a heat source and a heat sink. More particularly, the present invention relates to a thermally conductive material, an apparatus and a method for applying the same which eliminates the formation of air pockets between the thermally conductive material and the substrates to which it is bonded.

BACKGROUND OF THE INVENTION

The present invention relates to a thermally conductive interface material that is interposed between a source of heat, such as an electronic component and a heat sink. The most common example of this invention is the use of a thermal material between a semiconductor device and a heat sink so that heat generated by the semiconductor can be removed.

Typically, silicone or urethane binders filled with one or more thermally conductive materials are used as the thermal interface. One such product is commercially known as CHO-THERM ® thermally conductive materials, available from Chomerics, Inc.

In placing the thermally conductive material between the heat source and the heatsink, care must be taken to ensure that no air becomes trapped between the thermally conductive material and the adjacent substrate. Air is a notoriously poor conductor of heat and its presence reduces the ability of the thermally conductive material to transport heat from its source to its sink. This can lead to an overheating of the heat source. Moreover, the overheating will be localized at the spot where the air is trapped, causing the overheating to be concentrated in a small area making it more intense and its effects more devastating, especially to electronic components.

Moreover to ensure that air is not trapped, such thermally conductive interface materials are applied individually by hand. This is a labor extensive, slow process. Additionally, the assembly can only be done with fairly large components which contain a means for attaching them to the heat source, such as screws, rivets, etc.

Therefore, there is a need for a thermally conductive material that will eliminate the problem of air becoming trapped between the thermal material and the adjacent substrate and a method for forming a heat transferring assembly.

Moreover, there is a need for a process that will speed up the assembly of thermally conductive electroinc packages and for products that will provide thermal conductivity to smaller electronic assemblies.

OBJECTS AND SUMMARY OF THE INVENTION

The present invention provides a thermally conductive material which contains a means for eliminating air from between the surface of the thermally conductive material and the substrate to which it is joined. The means for eliminating the air consists of a series of grooves or channels or a series of throughholes in one or both major surfaces of the thermally conductive material and/or the heat sink or heat souce so that as pressure is applied between the thermally conductive material and the adjacent heat sink or heat source, any air is expelled through the grooves, channels or throughholes.

Preferably, the thermally conductive material has a polymeric binder that is a pressure sensitive adhesive, such as an acrylic or silicone pressure sensitive adhesive. The pressure sensitive thermally conductive material allows for bonding directly to the adjacent surfaces of the heat source and heat sink without the need for other retaining means such as screws, rivets, clamps, etc. It also allows for the use of thermal interface materials on electronic components which previously could not retain such materials, due to size, configuration, etc. Moreover, it allows for the automated application and assembly of thermally conductive electronic assemblies or packages. It is an object of the present invention to provide thermally conductive materials comprising a blend of a polymeric binder and a thermally conductive filler wherein the material has an air removing device selected from the group consisting of embossments and throughholes.

A further object of the present invention is to provide a thermally conductive, form stable sheet formed of a blend of a polymeric binder selected from the group consisting of acrylic resin silicone rubber, fluorosilicone rubber and polyurethane, a thermally conductive filler and wherein at least one major surface of the material contains embossments for the removal air upon the application of pressure to the material.

Another object of the present invention is to provide a means for dissipating heat comprising a thermally conductive material having a major surface for mounting a heat generating means and one or more means for dissipating heat from the heat generating means to the atmosphere, wherein the major surface has a means for removing air from between the heat generating means.

An additional object of the present invention is to provide an electrical assembly comprising a means for dissipating thermal energy, an electronic component which generates thermal energy and a means for transferring thermal energy from the electronic component to the means for dissipating thermal energy and the electronic component and wherein at least the means for transferring thermal energy has a means for removing air from between the means for transferring themral energy and the electronic components.

A further object of the present invention is to provide a process for assembling a thermally conductive electrical assembly comprising the steps of mounting a first surface of a means for transferring thermal energy to a means for disspating thermal energy, mounting a second surface of the means for transferring thermal energy to a means for generating thermal energy, wherein at least the second surface of the means for transferring thermal energy has a means for removing air from between the means for transferring thermal energy and the means for generating thermal energy when subjected to pressure and applying pressure to assembly to remove air from the assembly.

Another object of the present invention is to provide a thermally conductive interface comprised of a pressure sensitive adhesive polymeric binder and one or more thermally conductive fillers wherein the interface has a series of air removing devices formed in at least one surface of the interface.

IN THE DRAWINGS

DETAILED DESCRIPTION OF THE INVENTION

A preferred embodiment of the present invention comprises a form stable, sheet like thermally conductive material formed of a polymeric binder, one or more thermally conductive fillers and a means for removing air from between a major surface of the material and a substrate to which the major surface is mated. Such a device is shown in FIGS. 1 and 2.

Figure 1:
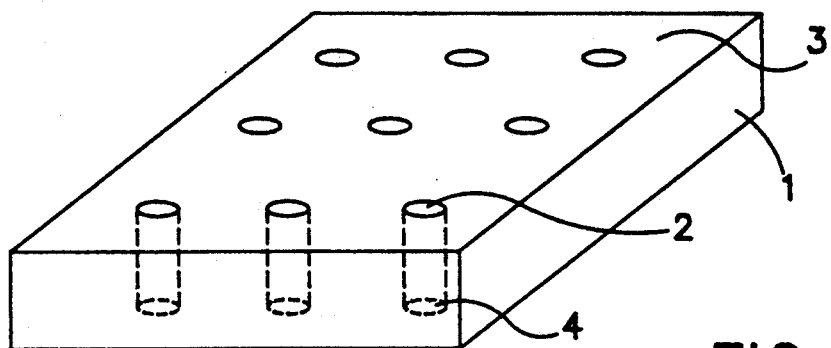
FIG. 1 shows a plan as view of first preferred embodiment of the thermally conductive material of the present invention.
Figure 3:
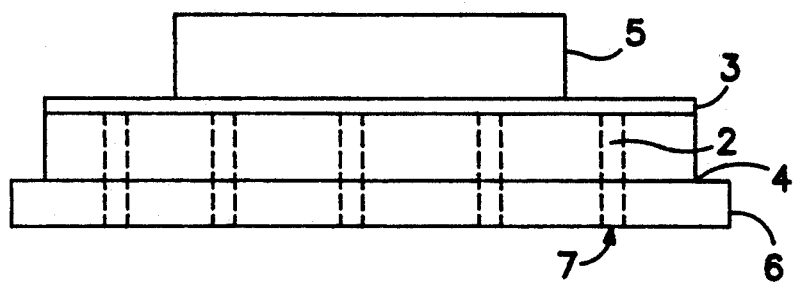
FIG. 3 shows a cross sectional view of a preferred embodiment of an assembly according to the present invention.

In FIG. 1, the thermally conductive material 1 has a series of throughholes 2 running from one major surface 3 to a second, opposite major surface 4. In use, the thermally conductive material is interposed between a heat source and a heat dissipator. The first major surface 3 of the material is adjacent to the heat source and the second major surface 4 is adjacent to heat dissipator. FIG. 3 shows the embodiment of FIG. 1 as assembled between the heat source 5 and heat dissipator 6. Also shown in FIG. 3 is the preferred embodiment in which the heat dissipator also has throughholes 7 which are arranged in such a manner so as to be in alignment, register or correspondence with the throughholes of the thermally conductive material.

The size (diameter), arrangement and number of throughholes should be sufficient to allow for the removal of substantially all of the air between the thermal material and the adjacent substrate to which it is mated yet insufficient so as to structurally weaken the material or to substantially reduce its thermal properties. Preferably, the throughholes are circular in shape, however, other shapes, such as square, rectangular, oval etc. may be used if desired.

Figure 2:
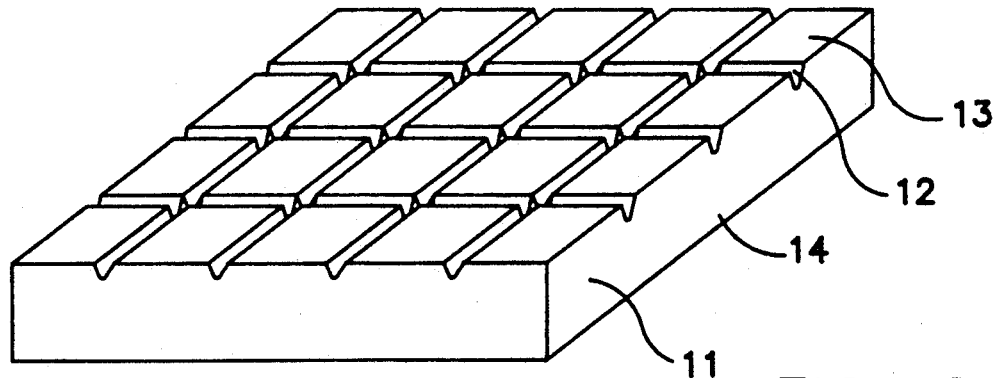
FIG. 2 shows a planar view of another preferred embodiment of the thermally conductive material of the present invention.

FIG. 2 shows an alternative embodiment of the thermally conductive material 11 wherein one of its major surfaces, in this instance its first major surface 13, has a series of grooves or channels formed in it which form a series of embossments or lands on the surface of the material. The channels act as the air removal device, 12. If desired, the second major surface, 14, may contain the air removal device instead of or in addition to the first major surface 13. The grooves or channels may be linear, or curvilinear or any other configuration. If desired they may run only in one direction across the surface of the material, such as parallel stripes or they may run in two different directions at an angle to each other as shown in FIG. 2. Preferably, there are two series of grooves running perpendicular to each other.

Another preferred embodiment of the present invention is an assembly of a thermal energy generating means, such as an electronic component, a thermal energy dissipating means, such as a heat sink or a heat spreader, and a thermal energy transferring means such as a thermally conductive polymeric material interposed between the generating means and the dissipating means so as to move the thermal energy from the generating means to the dissipating means. Either the transferring means and/or the heat dissipating means contains a means for removing air from between the heat transferring means and an adjacent surface of either the heat generating means and/or the heat dissipating means. The means for removing air is either the embossments or the throughholes described above in regard to the other preferred embodiments of FIGS. 1 and 2.

In an assembly which uses throughholes as the air removal means, such as is shown in FIG. 3, it is preferred that both the heat transferring means and the heat dissipating means contain a series of throughholes which correspond to and align or are in register with the throughholes of the other. By having throughholes which extend through the entirety of the thermal energy transferring and thermal energy dissipating means, one is able to ensure that air is removed from between the interface formed by the thermal energy generating means and the transferring means and the interface formed between the transferring means and the thermal energy dissipating means.

In another preferred assembly embodiment, the thermal energy transferring means has no air removal means. Rather the air removal means is formed on the heat dissipating means and/or the heat generating means. For example, a heat sink may have the surface, to which the thermally conductive pad will be mounted, grooved or cross hatched so as to form a series of channels through which air can be expelled as the thermal transfer means is applied to surface and fills the grooves or channels. It would be similar in configuration to the embodiment of the thermal material of FIG. 2. Likewise, the surface of the electronic component may contain such channels. Alternatively, the heat sink may use throughholes. Other arrangements in the assembly are possible so as to maximize the thermal capabilities of the assembly while allowing for maximum flexibility of the assembly design. For example, one could have air removal means on the surface of the thermally conductive material adjacent the electronic component and a similar means on the heat sink, etc.

The thermally conductive material may be selected from a variety of well-known polymer binders, such as acrylic resin, silicone and fluorosilicone rubber, and various polyurethanes filled with one or more thermally conductive fillers. Such materials formed of silicone or urethane are taught in U.S. Pat. No. 4,574,879 and U.S. Pat. No. 4,869,954 which are incorporated herein by reference in their entirities.

Preferably, the thermally conductive material is formed of a polymeric binder of a pressure sensitive adhesive material, such as silicone or an acrylic adhesive and one or more thermally conductive fillers. Such polymeric binders are well-known and commercially available. The preferred embodiment is a pressure sensitive acrylic adhesive, which are well-known and commercially available. Thermally conductive fillers suitable for use in the present invention are particulate solids capable of providing the material with the desired thermal conductivity. Preferably, these fillers are particulate solids which are electrically insulative as well as thermally conductive.

Examples of such particles include but are not limited to aluminum oxide, aluminum nitride, boron nitride, magnesium oxide and zinc oxide. If the material does not need to be electrically insulative, the fillers may include various thermally conductive metals such as silver, gold and copper or metal coated materials, such as silver coated glass, silver coated copper or silver coated aluminum.

The particles should be of a sufficiently small size as to not distort the surface of the thermally conductive material. Preferably the filler will be of a size from about 1 micron to about 50 microns, more preferably in a range of from about 5 microns to about 25 microns, most preferably about 10 microns. The fillers are to be included in the binder in an amount sufficient to provide the desired thermoconductivity. Preferably, the fillers are included in amount of from about 10% by weight to about 85% by weight of the finished product. More preferably, the fillers are included in amounts ranging from about 40% by weight to about 75% by weight and most preferably about 68% by weight. The more preferred fillers are boron nitride, mangesium oxide and aluminum oxide with boron nitride being the most preferred filler.

Additional ingredients may also be added so long as they do not interfere with the conformability or thermal conductivity of the product. For example, it is preferred to use a solvent when compounding the binder so as to make the mixing and application easier. If desired, one may also add a pigment, flame retardant, and/or antioxidant to the binder. As the thermally conductive material of the present invention is form stable, it may be used by itself as a thermal transfer device without the incorporation of a support layer.

If desired, one may incorporate one or more layers of a support material to increase the thermally conductive material's toughness, resistance to elongation and tearing and other mistreatment. The incorporation of support materials is particularly desired where the problems of cut-through or overtorqued fastners may occur. Cut-through is caused by burrs or sharp metal protusions on one or both of the surfaces to be thermally connected. These burrs or protrusions are believed to cut or tear the thermally conductive material and provide a pathway through which an electrical short may occur. Similarly, overtorquing of the fastening devices is believed to subject the thermally conductive material to abnormally strong tensions which may also cause tearing and electrical shorts. Additionally, any tearing or penetration of the thermally conductive material allows for the formation of a pocket of air, which as described above is a poor thermal conductor. These air prockets can lead to localized hot spots and an overall decline in thermal performance.

The support material should not interfere with the thermal conductivity of the thermally conductive material. Preferably, the support material is itself thermally conductive. In applications where electrical insulation between the components is important, the selected support material should be dielectric.

Examples of reinforcing materials useful in the present invention include, but are not limited, to glass fiber, mesh or cloth, plastic fiber, mesh cloth or films and metal fiber, mesh, cloth or foils.

The glass cloth may be woven or unwoven.

The plastic support material is preferably a mesh material, or a film. If a film, it may be solid or foraminous. Examples of suitable plastics include nylons, polyesters, polyamides, polyimides, polyethylenes, or PEEK. Well-known plastic films particularly useful in the present invention are MYLAR ® polyester films and KAPTON ® polyimide films. As plastic films generally exhibit poor thermal conductivity properties, it is desirable to use a film which contains a thermally conductive filler. One such filler film is KAPTON MT ®, a polyimide film which contains either an aluminum oxide or boron nitride filler. This material exhibits twice the thermal conductivity of an equivalent unfilled film. Alternatively, one may use a very thin film layer so as to minimize its effects on the thermal transfer.

Where electrical insulation is not a requirement, metal mesh cloths or foil are the preferred support material due to their high thermal conductivity. Examples of preferred metals useful as a mesh cloth or a foil, include but are not limited to, aluminum, copper, silver, iron and tinned copper. Regardless of the support material used, it should be as thin as practicable while still providing the desired support.

The support materials may be embedded in the thermally conductive material or coated, calendered or attached to one surface of the thermally conductive material. Preferably, the support material and thermally conductive material are formed into a laminate of three or more layers with the support layer being the center layer and the thermally conductive material forming the outer layers.

The three layered material with the support layer in the middle is the preferred embodiment of the present invention. One such embodiment is shown in FIG. 4.

Figure 4:
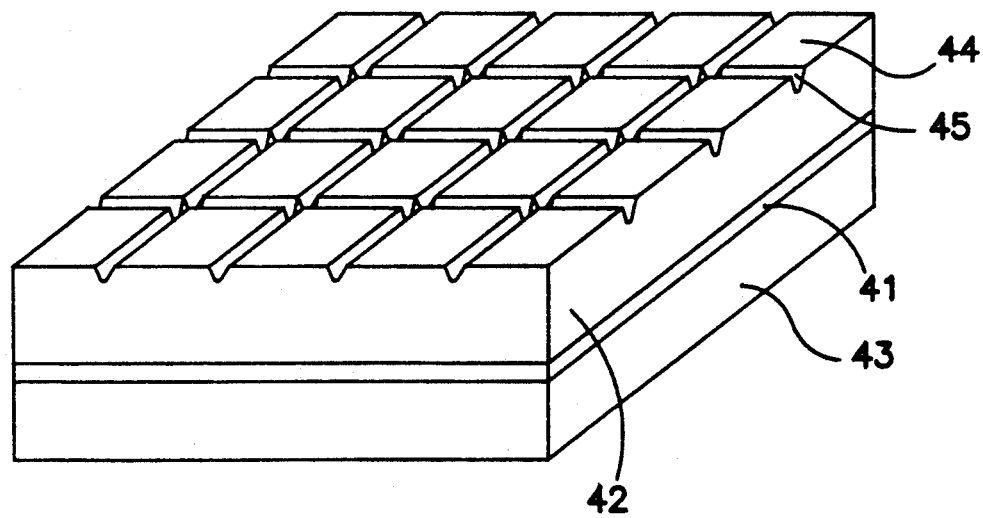
FIG. 4 shows a planar view of another preferred embodiment of the thermally conductive material of the present invention.

In FIG. 4, the thermally conductive material has a central support layer 41 and two outer layers of thermally conductive pressure sensitive polymer, 42 and 43, each bonded respectively to a major surface of the central support layer. At least one major surface, such as 44, has a series of air removing devices formed in its surface. In this instance, the use of a series of grooves or channels 45 to form embossments is shown.

The pressure sensitive material may be formed as a continuous tape, a tape containing discrete parts or as individual pads or pieces.

The heat conductive material of the present invention may be formed in many ways.

One method of forming the material is to combine the acrylic binder with the selected filler or fillers and thoroughly mix the ingredients while slowly adding a solvent until a liquid having a smooth texture is achieved. The material is then cast onto a release sheet such as a piece of glass, Mylar ® film or coated paper, or on to a support layer and heated to drive off the solvent and form the thermally conductive material.

An alternative method is to thoroughly mix the ingredients together with a sufficient amount of solvent to obtain a thin liquid. The liquid can then be sprayed or coated onto a surface such as a release sheet or a reinforcing material such as a glass fiber cloth, a Kapton ® film or metal foil and heated to cure. Additionally, the same liquid formulation may have a porous support material, such as a glass fiber mesh, dipped into it to form the desired coating.

Another method of forming the heat conductive material of the present invention is by molding. This is particularly useful when one wishes to form a substantially thick heat conductive layer or when one wishes to form a specifically shaped heat conductive material. In molding the heat conductive material, the components are mixed with a solvent and poured into a prefabricated mold which contains the desired embossments, channels or grooves or throughholes. Preferably, one may coat the inside of the mold with a release coating before adding the components. The mold is then heated or otherwise sujected to an external energy field to form the molded shape. Instead of using a separate mold, it may be desired to use a mold which allows the heat conductive material to be molded in place directly to one of the surfaces it will contact.

A preferred method is to form a laminated pressure sensitive adhesive material of three or more layers in which the center layer is formed of a support layer discussed above, such as glass mesh, KAPTON ® film or metal foil and an outer layer of the thermally conductive material is coated on each side of the support layer to form a cohesive laminated material. The coating may occur sequentially so that one side of the support layer is coated and cured and then the process is repeated on the opposite side. Preferably, the coating is applied to both sides simulataneously. As the material is adhesive, the outer surfaces are covered by a release layer such as a coated paper, foil or a plastic film. The thermal conductive layers then have their air removal means formed. If embossments or grooves or channels are desired, they are preferably formed by passing the material through a pair of rollers, at least one of which has the desired embossment or groove configuration formed upon it. The embossments or grooves are then transferred to the tape. The throughholes may be formed by a punch or similar means for forming holes.

The thermally conductive product may be formed into continuous or discontinuous tapes; or sheets and then cut to the desired shape; or molded in the desired shape at the outset, either in a mold or directly in place, as described above.

The resultant thermally conductive material should be sufficiently soft so as to conform to the surfaces with which it interfaces. Preferably, the material should have a Shore A harness of less than 100, more preferably, a Shore A hardness of about 70.

The properties exhibited by a typical product prepared in accordance with the present invention are as follows:

Thickness—1 to 20 mils±1 mil, preferably about 5-8.
Volume Resistivity—$1 \times 10^{10}$ ohm-cm (ASTM D-257)
Dielectric Strength—6000 Volts minimum (ASTMD-149).
Hardness, Shore A—70 to 100 (ASTM D-2240)
Thermal Impedence—0.09° to 0.40° C./W (Chomerics No. 27).
Thermal Conductivity—$1.2 \times 10$- to $1.6 \times 10$- CAL/°cm sec. (Chomerics No. 28).

Several processes for forming the thermally conductive assembly can be used.

In a first preferred embodiment, one manually removes a coversheet, if present, from one side of the thermally conductive transfer means and places the thermally conductive transfer means against a surface of a thermal energy dissipating means and then removes a coversheet, if present, from the other side of the thermally conductive transfer means and places a heat source, such as an electronic component against the opposite exposed surface of the transfer means. The assembly is then subjected to pressure, such as between one's fingers, to evacuate the air through the air removal means of the heat source, transfer means and/or dissipating means.

Figure 5:
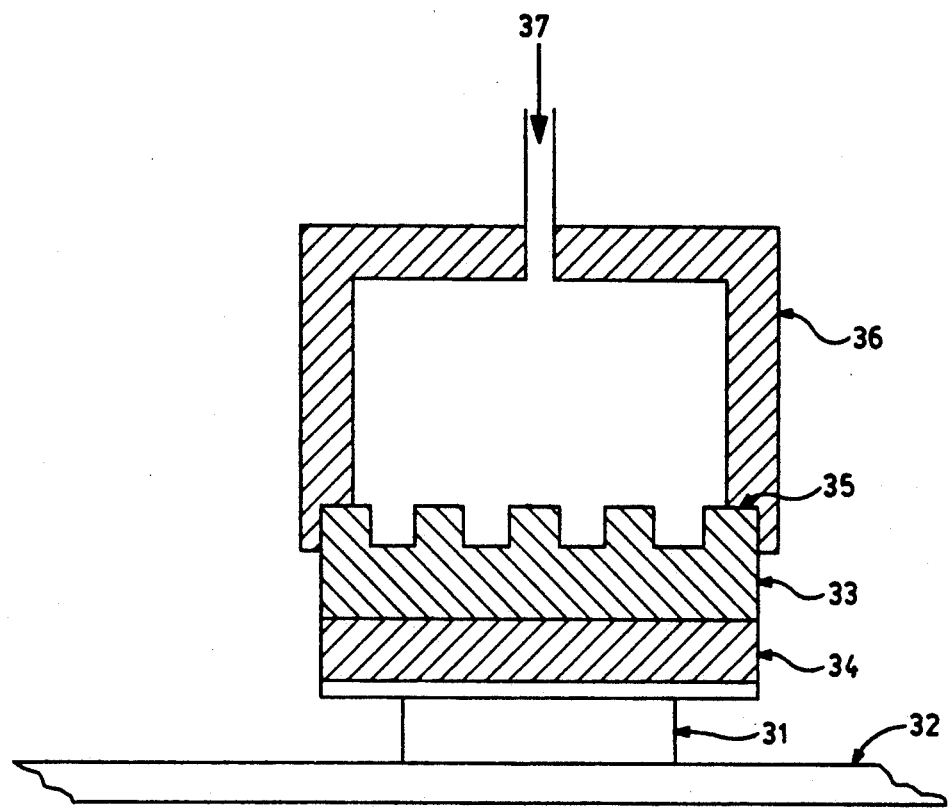
FIG. 5 shows a cross sectional view of a preferred apparatus for forming the assembly.

Another preferred process for assembling a thermally conductive electronic assembly is shown in FIG. 5 and is particularly useful with the acrylic based, pressure sensitive tape that is preferred in this invention. The heat source, 31, such as a semiconductor, is placed against a holding means 32, a thermally energy transfer means 33 has a first major surface placed upon and bonded to an exposed surface 34 of the heat source and a thermal energy dissipating means 35, in this instance a heat sink is placed upon and bonded to a second major surface of the transfer means, an assembly holder 36 is used to maintain the assembly in position and pressure is applied by the holder through a pressure means 37 to move the various components together and to evacuate the air between the various surfaces of the components through an air removal device formed on one or both surfaces of the transfer means 33, and/or the heat source 31, and/or the dissipating means 35. The assembly may then be removed from the holder. Alternatively, if the transfer means is not adhesive, other means holding the components together, such as clamps, screws, rivets, etc. may be applied while the assembly is in the holder.

The pressure applied may be positive or negative (i.e. a vacuum). It is preferred to use a positive pressure. The amount of pressure, positive or negative, that is applied should be sufficient to remove substantially all of the air present between the adjacent surfaces, yet insufficient to damage any of the components, especially the electronic component.

While shown as a single component apparatus and process, it is understood that the above described apparatus could be automated so as to make the process continuous. In such an example, the thermal transfer means is in the form of continuous tape, either containing a continuously formed thermal material that is cut to length or if desired containing a series of discrete, individual, pressure sensitive pads or pieces.

The air removal device, whether it is embossments, channels or grooves should be of a height and width sufficient to allow for the removal of air but insufficient so as to allow for the return of air after the interface has been applied to a surface. Preferably, the air removal device in these instances is about 1 to 10 mils in height or depth, as the case may be.

While this invention has been described with references to its preferred embodiments, other embodiments can achieve the same result. Variations and modifications of the present invention will be obvious to those skilled in the art and it is intended to cover in the appended claims all such modifications and equivalents as fall within the true spirit and scope of this invention.

What is claimed is:

1. A thermally conductive interface comprising a first layer of thermally conductive pressure sensitive adhesive, a support layer overlaying the first layer, a second layer of thermally conductive pressure sensitive adhesive overlaying the support layer and an air removal device selected from the group consisting of embossments, channels, grooves, and throughholes, the air removal device being formed on at least an exposed surface of the first layer.

2. The interface of claim 1 wherein the thermally conductive pressure sensitive adhesive is formed of a pressure sensitive binder selected from acrylic resin and silicone rubber and one or more thermally conductive fillers.

3. The interface of claim 1 wherein the air removal device is formed on the exposed surface of the first layer and on an exposed surface of the second layer.

4. The interface of claim 1 wherein the air removal device is a series of throughholes extending from an exposed surface of the first layer, through the support layer and second layer to an exposed surface of the second layer.

5. A thermally conductive tape comprising a first layer of thermally conductive, electrically insulative pressure sensitive adhesive, a support layer overlaying the adhesive layer and a second layer of thermally conductive, electrically insulating pressure sensitive adhesive, the second layer being on top of and bonded to the support layer and wherein at least one of the layers has an air removal device selected from the group consisting of embossments, channels, and grooves, formed in its exposed surface.

6. The tape of claim 5 wherein the second surface of the second layer contains an air removal device formed in its exposed surface.

* * * * *